United States Patent
Ma et al.

(10) Patent No.: US 10,340,305 B2
(45) Date of Patent: Jul. 2, 2019

(54) IMAGE SENSOR AND IMAGE SENSOR PIXEL HAVING JFET SOURCE FOLLOWER

(71) Applicant: DARTMOUTH COLLEGE, Hanover, NH (US)

(72) Inventors: Jiaju Ma, West Lebanon, NH (US); Leo Anzagira, Hanover, NH (US); Eric R. Fossum, Wolfeboro, NH (US)

(73) Assignee: DARTMOUTH COLLEGE, Hanover, NH (US)

( * ) Notice: Subject to any disclaimer, the term of this patent is extended or adjusted under 35 U.S.C. 154(b) by 0 days.

(21) Appl. No.: 15/563,593

(22) PCT Filed: Mar. 31, 2016

(86) PCT No.: PCT/US2016/025444
§ 371 (c)(1),
(2) Date: Sep. 30, 2017

(87) PCT Pub. No.: WO2016/161214
PCT Pub. Date: Oct. 6, 2016

(65) Prior Publication Data
US 2018/0090537 A1    Mar. 29, 2018

Related U.S. Application Data

(60) Provisional application No. 62/141,222, filed on Mar. 31, 2015.

(51) Int. Cl.
*H01L 27/146* (2006.01)
*H04N 5/3745* (2011.01)
*H04N 5/355* (2011.01)

(52) U.S. Cl.
CPC .... *H01L 27/14679* (2013.01); *H01L 27/1461* (2013.01); *H01L 27/14603* (2013.01);
(Continued)

(58) Field of Classification Search
CPC ............. H01L 27/146; H01L 27/14679; H01L 27/1461; H01L 27/14614; H01L 27/14641; H01L 27/14683
See application file for complete search history.

(56) References Cited

U.S. PATENT DOCUMENTS

| 5,712,498 A | 1/1998 | Reich et al. |
| 2009/0096900 A1* | 4/2009 | Pang ................. H01L 27/14621 348/294 |

(Continued)

FOREIGN PATENT DOCUMENTS

WO    WO 2015/006008 A1    1/2015

OTHER PUBLICATIONS

Sheppard et al., "Development and Operation of Buried Channel Charge Coupled Devices in 6h Silicon Carbide" Purdue Libraries, May 1, 1996 (May 1, 1996), figure 2.10; p. 28-36 [online] URL+ http://docs.lib.purdue.edu/ecetr/100>.

(Continued)

*Primary Examiner* — Phuc T Dang
(74) *Attorney, Agent, or Firm* — David V. Rossi; Haug Partners LLP

(57) ABSTRACT

Some embodiments provide an image sensor pixel comprising a junction field effect transistor (JFET) and a floating diffusion configured to act as the gate of the JFET. An image sensor may comprise a plurality of pixels, at least one pixel comprising a floating diffusion region formed in a semiconductor substrate, a transfer gate configured to selectively cause transfer of photocharge stored in the pixel to the floating diffusion, and a JFET having (i) a source and a drain coupled by a channel region, and (ii) a gate comprising the floating diffusion region.

23 Claims, 12 Drawing Sheets

(52) U.S. Cl.
CPC .. *H01L 27/14614* (2013.01); *H01L 27/14616* (2013.01); *H01L 27/14683* (2013.01); *H01L 27/14689* (2013.01); *H04N 5/37457* (2013.01); *H01L 27/1463* (2013.01); *H01L 27/1464* (2013.01); *H01L 27/14641* (2013.01); *H04N 5/3559* (2013.01); *H04N 5/3745* (2013.01)

(56) References Cited

U.S. PATENT DOCUMENTS

| | | | | |
|---|---|---|---|---|
| 2009/0251556 | A1* | 10/2009 | Mabuchi | H01L 27/14621 348/222.1 |
| 2011/0297814 | A1* | 12/2011 | Nakayama | H04N 5/363 250/208.1 |
| 2012/0286138 | A1 | 11/2012 | Yamazaki | |
| 2013/0146747 | A1* | 6/2013 | Hynecek | H01L 27/1464 250/208.1 |
| 2015/0179452 | A1* | 6/2015 | Hower | H01L 29/0657 257/272 |

OTHER PUBLICATIONS

Ma et al., "A Pump Gate Jot Device with High Conversion Gain for a Quanta Image Sensor." vol. 3, No. 2, Mar. 2015, published Jan. 12, 2015 (Jan. 12, 2015), p. 73 [online] URL=<http://ericfossum.com/Publications/Papers/2015%20JEDS%20Pump%20Gate%20Jot.pdf>.

International Search Report and Written Opinion issued (dated Jul. 26, 2016) in corresponding International Application No. PCT/US2016/025444. (9 pages total.)

\* cited by examiner

IMAGE SENSOR AND IMAGE SENSOR PIXEL HAVING JFET SOURCE FOLLOWER

RELATED APPLICATIONS

This application is filed pursuant to 35 U.S.C. § 371 based on International Application No. PCT/US2016/025444, filed Mar. 31, 2016, which claims the benefit of U.S. Provisional Application No. 62/141,222, filed Mar. 31, 2015, which is hereby incorporated herein by reference in its entirety.

BACKGROUND

The Quanta Image Sensor (QIS) has been proposed as a possible next-generation image sensor. In the single-bit QIS, the specialized, sub-diffraction-limit sized binary-output photo-element sensitive to a single photoelectron is called a "jot". Central to single-bit as well as multi-bit QIS implementations is single-electron sensitivity (~0.15 e– r.m.s.) which can be obtained from high, in-pixel conversion gain, e.g., more than 1000 µV/e–. For the high conversion gain needed, the capacitance of the floating diffusion (FD) node needs to be minimized. According to the present inventors' previous QIS work, the capacitance of the FD node has been greatly reduced, but further reductions in FD node capacitance and/or additional or alternative ways to reduce FD node capacitance may still be advantageous and/or desired.

By way of example, in accordance with the present inventors' previous QIS work, some QIS pixel designs incorporating a pump-gate charge transfer with a distal FD and a gateless reset have a greatly reduced FD total capacitance such that the residual part of the FD capacitance is mainly attributed to the MOSFET source-follower (SF). According to a calculation for an example of such a QIS design, to achieve a conversion gain of 10000 µV/e–, the total FD capacitance needs to be lower than 0.16 fF. With a 65 nm CMOS process, a MOSFET SF will contribute about 0.3 fF to the FD capacitance, thus effectively rendering it more difficult to achieve the 10000 µV/e– conversion gain for such a design at this technology node.

SUMMARY OF SOME EMBODIMENTS

Some embodiments provide an image sensor pixel comprising a junction field effect transistor (JFET) and a floating diffusion configured to act as the gate of the JFET. In some embodiments, an image sensor may comprise a plurality of pixels, at least one pixel comprising a floating diffusion region formed in a semiconductor substrate, a transfer gate configured to selectively cause transfer of photocharge stored in the pixel to the floating diffusion, and a JFET having (i) a source and a drain coupled by a channel region, and (ii) a gate comprising the floating diffusion region.

In some embodiments, the channel region comprises a first doped region of a first conductivity type configured to conduct current between the source and drain along a lateral direction substantially parallel to a surface of the substrate, the floating diffusion region comprises a second doped region of a second conductivity type opposite to the first conductivity type, and the second doped region of the floating diffusion is disposed adjacent to and beneath the first doped region along the lateral direction between the source and drain.

In some embodiments, the floating diffusion and the channel region may be configured such that charge selectively transferred to the floating diffusion by operation of the transfer gate modulates current flow between the source and drain via the channel region.

And in some embodiments, the floating diffusion and the channel region may be configured such that charge selectively transferred to the floating diffusion by operation of the transfer gate causes a change in the gate potential that is followed by the potential of the source of the JFET.

In some embodiments, the capacitance of floating diffusion is small enough to provide a conversion gain of at least 500 µV/e– and the image sensor is configured as a QIS.

In some embodiments, the channel may be configured as a buried channel.

While pixels according to some embodiments of the present invention are well-suited for use in image sensors demanding very high conversion gain (e.g., QIS, qDIS, or other single-bit or multi-bit photoelectron counting sensors), it will be understood in view of the ensuing disclosure that some embodiments of the present invention are also applicable to conventional CMOS image sensors (e.g., present-day, commercially available CMOS image sensors for consumer, manufacturing, and/or scientific applications).

Throughout the description and claims, the following terms take at least the meanings explicitly associated herein, unless the context dictates otherwise. The meanings identified below do not necessarily limit the terms, but merely provide illustrative examples for the terms. The phrase "an embodiment" as used herein does not necessarily refer to the same embodiment, though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

Also, as used herein, "n and "p" designations (e.g., as in "n-type," "p-type," "n-well," etc.) are used in ordinary and customary manner to designate donor and acceptor type impurities that promote electron and hole carriers, respectively, as majority carriers. The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrates" in the following description, previous process steps may have been utilized to form regions or junctions in the base semiconductor structure or foundation. In addition, the semiconductor need not be silicon-based, but may be based on, for example, silicon-germanium, germanium, or gallium arsenide.

In addition, as used herein, unless the context clearly dictates otherwise, the term "coupled" refers to directly connected or to indirectly connected through one or more intermediate components and, in some contexts, may also denote or include electrically coupled, such as conductively coupled, capacitively coupled, and/or inductively coupled. Further, "conductively coupled" refers to being coupled via one or more intermediate components that permit energy transfer via conduction current, which is capable of including direct current as well as alternating current, while "capacitively coupled" refers to being electrostatically coupled through one or more dielectric media, and possibly also via one or more intervening conductors (e.g., via a series of capacitive components), that permit energy transfer via displacement current and not via direct current. Those skilled in the art will further understand that elements may be capacitively coupled intentionally or unintentionally (e.g., parasitically) and that in some contexts, elements said to be capacitively coupled may refer to intentional capacitive coupling. In addition, those skilled in the art will also understand that in some contexts the term "coupled" may refer to operative coupling, through direct and/or indirect connection. For instance, a conductor (e.g., control line) said to be coupled to the gate of a transistor may refer to the conductor being operable to control the gate potential so as to control the operation of the transistor (e.g., switching the transistor between "on" and "off" states), regardless of whether the conductor is connected to the gate indirectly (e.g., via another transistor, etc.) and/or directly.

It will be understood that simply for ease of reference and clarity of exposition with respect to describing cross-sectional views of pixels shown in the drawings, terms such as "upper," "top," "lower," "bottom," "overlying," "underlying," "above" and "below," and the like, with reference to a layer, junction, doped region, or other structure refers to a relative spatial position with respect to the perspective of the depicted view and does not denote a preferred or required orientation. In this regard, it will also be understood that such terms may not have a relation to terms such as "frontside" or "backside" with respect to the surface of the image sensor's wafer/substrate that is configured to be illuminated. For instance, depending on the viewing perspective, a first doped region may be said to overlie or be on top of a second doped region, even though the first doped region might be disposed closer to the "backside" surface of the wafer/substrate (and the image sensor may be configured for backside illumination). It is understood, therefore, as noted, that terminology such as "top," "upper," "bottom," "lower," and the like, as used herein is a convention simply for convenience and ease of reference with respect to referring to different layers, and does not otherwise impart any limitation on the overall design and/or orientation of an image sensor or pixel in accordance with the present disclosure.

In this regard, for ease of reference, as used herein, two layers, regions, or other structures/elements may be referred to as being "adjacent" if they do not include one or more intervening layers, regions (e.g., doped regions), or other structures/elements. In other words, two layers, regions, or other structures/elements referred to spatially (e.g., "on," "above," "overlying," "below," "underlying," etc.) with respect to each other may have one or more intervening layers, regions, or other structures/elements; however, use of the term "adjacent" (or, similarly, "directly," such as "directly on," "directly overlying," and the like) denotes that no intervening layers, regions, or other structures/elements are present.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of some embodiments of the invention, both as to structure and operation, will be understood and will become more readily apparent in view of the following description of non-limiting and non-exclusive embodiments in conjunction with the accompanying drawings, in which like reference numerals designate the same or similar parts throughout the various figures, and wherein.

DETAILED DESCRIPTION OF SOME EMBODIMENTS

Illustrative embodiments of an image sensor pixel having a JFET source-follower are disclosed. As those skilled in the art will understand in view of the present disclosure, embodiments according to the present disclosure are particularly well-suited for implementing a QIS (e.g., a single bit or multi-bit QIS having, for example, a full well capacity (FWC) of $2^n-1$ photocarriers, where n is an integer typically not greater than 6 or 7) as well as other jot-based image sensors.

Briefly, in some embodiments, the pixel comprises a floating diffusion (FD) configured as the gate of the JFET source-follower. In such embodiments, the FD comprises a first semiconductor region of a first conductivity type (e.g., n-type) that is configured to control, based on the quantity of photocharge transferred to the FD from a photodiode of the pixel, the conductance of a second semiconductor region that has a second conductivity type opposite to the first conductivity type (e.g., p-type) and is configured as a channel region of a JFET.

Such embodiments are well suited, for example, for reducing the FD capacitance by reducing the SF capacitance (e.g., compared to a pixel/jot that includes a MOSFET SF), and may be advantageously implemented together with a pump-gate-type charge transfer gate with a distal FD and/or a gateless reset to provide a pixel having very low FD capacitance and, concomitantly, very high conversion gain, suitable for QIS implementations.

Additionally, a JFET SF in accordance with some embodiments generally has better noise performance than a MOSFET SF, thus reducing the minimum high conversion gain needed or desired for a given implementation (e.g., of a QIS pixel). Also, because the gate-to-source capacitance in a JFET SF is a junction capacitance, which is typically much smaller than the oxide capacitance in MOSFET, the total FD capacitance for a pixel using a JFET SF will be greatly reduced compared to one using a MOSFET SF. In a TCAD simulation, with a design in accordance with the illustrative embodiments described below, a 2 mV/e− conversion gain was detected without metal wires included, and a 1.7 mV/e− conversion was detected with metal wires included.

Additional aspect, features, and advantages of some embodiments of the present invention will be further understood in view of the following description of various illustrative embodiments.

Figure 1A:
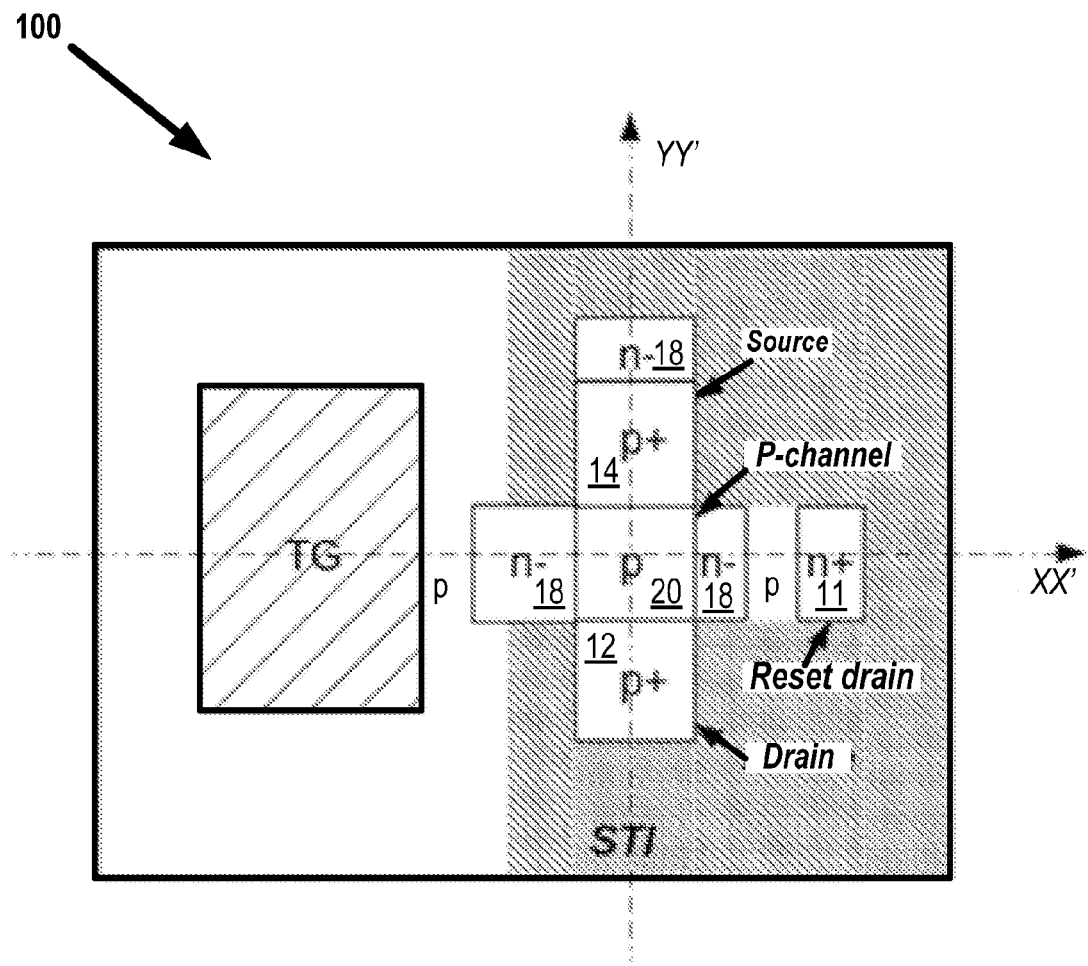
FIG. 1A schematically depict a plan view of an illustrative pixel of an image sensor, in accordance with some embodiments of the present disclosure.
Figure 1B:
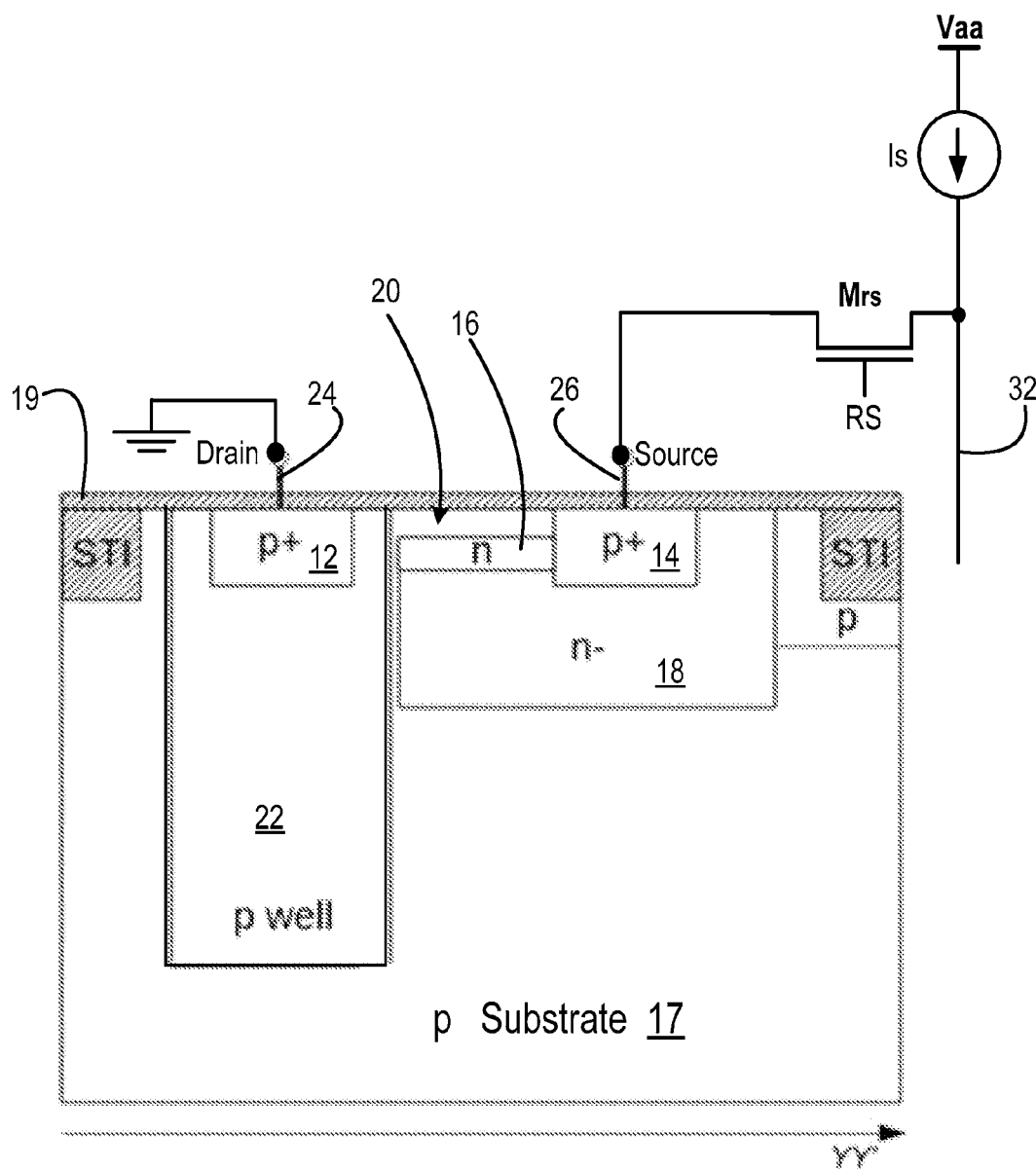
FIGS. 1B and 1C schematically depict respective orthogonal cross-sectional views of an illustrative pixel according to the embodiment of FIG. 1A according to some embodiments of the present disclosure.
Figure 1C:
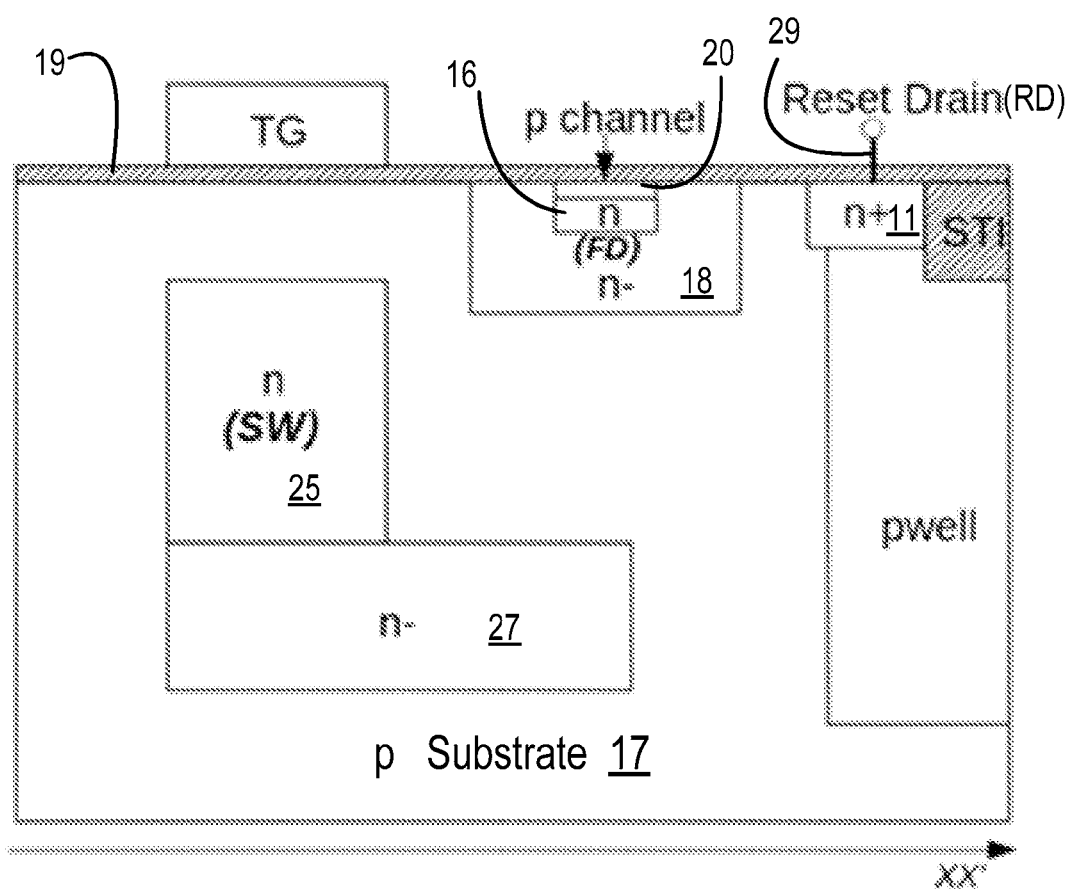

FIG. 1A schematically depicts a plan view of a portion of an illustrative pixel 100 of an image sensor in accordance with some embodiments according to the present disclosure. FIGS. 1B and 1C depict illustrative cross-sectional doping schematics of the pixel of FIG. 1A along respective orthogonal directions as indicated by the cross-sectional reference lines XX' and YY', while also schematically showing a readout MOSFET Mrs (e.g., in-pixel row-select transistor) for the pixel and a column bus 32. (As will be understood, in response to a readout signal RS, Mrs selectively couples the JFET source to column bus 32 that is biased by current source Is and coupled to additional out-of-pixel readout circuitry.) For clarity of exposition, as will be understood by those skilled in the art, FIGS. 1A, 1B, and 1C (and, likewise, FIGS. 2A and 2B) depict features in an illustrative, idealized/simplified manner, and do not depict all features or elements that are or may be included in the pixel; for instance, metallization, interlayer dielectrics, vias/contacts, and the like, are not shown. It will also be understood in view of the present disclosure that while this illustrative embodiment is configured for backside illumination (BSI), embodiments in accordance with the present disclosure are not limited to BSI configurations; frontside-illuminated embodiments may be implemented with a FD that also acts as the gate of JFET SF.

As depicted in FIGS. 1A-1C, an illustrative embodiment of a jot pixel formed in a p-type substrate 17 and configured with a floating diffusion that acts as the gate of a JFET SF includes (i) a pump-gate type transfer gate (TG) that substantially or entirely overlies a photodiode region comprising n-type storage well (SW) region that accumulates/stores photocarriers (photoelectrons) generated in the pixel region during an integration period, (ii) a floating diffusion FD distal laterally to (e.g., spaced away from and non-overlapping with) the TG and comprising n-type doped region 16 disposed in a more lightly doped n-type region (e.g., n-) 18, (iii) a reset drain (RD) comprising an n+ doped region 11 displaced laterally from and configured for gate-less reset of the FD, and (iv) p+ doped regions 12 and 14 contacting a p-type region 20 that is disposed therebetween and overlies n-type region 16 of the FD and is laterally bound by n-doped region 18 of the FD.

Also schematically shown is (i) a dielectric layer 19 that forms part of (e.g., the gate dielectric) the TG gate stack and extends over the pixel (e.g., providing surface passivation), and (ii) a more lightly doped (n-) n-type region 27 disposed beneath the storage well (SW) region (e.g., the lighter doping relative to the n-type doping of SW region 25 providing for generated photocarriers to drift towards the storage well (SW) region 25. As also shown, drain and source contacts 24 and 26 may be formed through dielectric 19, andelectrical isolation may be provided by shallow trench isolation (STI).

As will be understood by those skilled in the art in view of the present disclosure, p+ regions 12 and 14, p-type region 20, and the FD thus are configured, respectively, as drain, source, channel, and gate regions of a JFET SF. And, as configured, the JFET channel region overlies the FD/gate region that is operative to modulate/control the JFET channel, thus providing for a compact, small-footprint design well-suited for QIS implementations. This configuration according to some embodiments such as the embodiment of FIGS. 1A-1C provides for the JFET channel conduction direction between source and drain to be generally orthogonal to the direction of charge transfer from the photodiode charge storage well to the FD.

In accordance with the illustrative embodiment of FIGS. 1A-1C, the pump-gate structure and operation may be implemented in accordance with low-full-well-capacity vertical pump-gate pixels as disclosed in (i) US Provisional Application No. 61/973,825, filed Apr. 1, 2014, entitled CMOS Image Sensor with Pump Gate and Extremely High Conversion Gain, and (ii) "A Pump-gate Jot Device with High Conversion Gain for a Quanta Image Sensor," IEEE Journal of the Electron Devices Society, 3(2), February 2015, each of which is hereby incorporated by reference herein in its entirety. For example, although not explicitly shown in FIG. 1C, such a vertical pump-gate pixel may include a p+ doped pinning region laterally bounding the buried n-type charge storage region, as disclosed in, for example, in the above-referenced US Provisional Application and IEEE journal article. It will be understood, however, that various embodiments according to the present disclosure are not restricted to using a pump-transfer gate nor a photodiode disposed substantially beneath the transfer gate, and may be implemented using any photodiode and transfer gate configuration suitable for satisfying the design requirements of a given implementation (e.g., including configurations having a pinned-photodiode laterally disposed relative to the transfer gate).

The gate-less reset may be implemented in accordance with embodiments described in US Provisional Application No. 62/128,893, filed Mar. 5, 2015, entitled Gateless Reset for Image Sensor Pixels, which is hereby incorporated by reference herein in its entirety. As will be understood by those skilled in the art, the illustrative gateless reset embodiment shown in FIGS. 1A-1C does not include a reset transistor gate formed between the FD and reset drain (RD) regions (e.g., as shown, there is no gate electrode stack disposed on the surface above and between the FD and the RD). In operation, the FD potential is reset by selectively applying a voltage pulse to the RD via a conductive line 18 (e.g., interconnect metallization) to control charge transfer from the FD region to the RD region, without employing a transistor-gate-controlled conductive channel (e.g., comprising inversion layer charge) between the FD and RD. In some embodiments, the RD may also includes a less heavily doped (e.g., compared to the n+ doping of region 11) n-type region disposed adjacent to region 11 laterally in the direction of the FD. It will be understood, however, that various embodiments according to the present disclosure are not restricted to using gateless reset of the FD; e.g., a reset gate transistor, possibly implemented as a pump-gate (e.g., not overlapping the FD region), may be employed in various embodiments.

In accordance with the foregoing description of the illustrative embodiment of FIGS. 1A-1C, within the JFET source follower, the source and the drain are formed on p+ doping wells 12 and 14, and they are connected by a p-type channel 20, which is surrounded by an n-doped well. More specifically, underneath the p-type channel 20, as depicted in FIG. 1B, there is an n-type doped region 16, which acts as the floating diffusion (FD) charge storage node and the JFET gate.

Briefly, in operation of this illustrative embodiment, photon-generated electrons are collected/accumulated in the SW potential well of region 25, and are selectively transferred to the FD in a charge transfer operation by selective operation of transfer gate TG. The transferred electrons in FD accumulate in the n-type region 16, thus changing the potential in region 16 and n-well 18. The potential of region 16 modulates the depletion region in, and thus the resistivity of, the overlying p-type channel; thus, the resistivity of the p-type channel is modulated according to the charge transferred to region 16 of the FD. And since the source of the JFET source follower is selectively connected to a current source (e.g., Is) during readout, the voltage of the JFET source will change and follow the potential of the n-well. Accordingly, by measuring the voltage change of the source node (using off-pixel readout circuitry (not shown) coupled to column 32), the photon-generated electrons can be detected. As will be understood by those skilled in the art, operation of the illustrative pixel of FIGS. 1A-1C may employ correlated-double-sampling by providing appropriate readout control signal timing and off-pixel-array readout circuitry.

As will be understood by those skilled in the art in view of the present disclosure, and in accordance with the embodiment of FIGS. 1A-1C, to improve the performance of the JFET source follower, the JFET source region should be surrounded by an n-doping well, so that the source-to-drain current will be confined to flowing through the p-type channel 20. Any current leakage path between the source and the drain will reduce the gain of the source follower. The n-type doping well 16, which acts as the FD charge storage region and JFET gate, should be more heavily doped than the n-doping well 18 nearby, so that the transferred electrons will only accumulate in then region 16. Any electrons accumulated in other locations of the n-well will not be effective to modulate the p-channel (20) resistivity. For back side illuminated (BSI) image sensors, the JFET drain may also act as the substrate contact. So to ensure a good connection to the bulk, a deep p-well 22 may be formed underneath the drain region 12. In some embodiments, substrate 17 may include a p+ region formed in the backside surface to provide for a backside contact (not shown in the illustrative BSI embodiment of FIGS. 1A-1C).

Figure 2A:
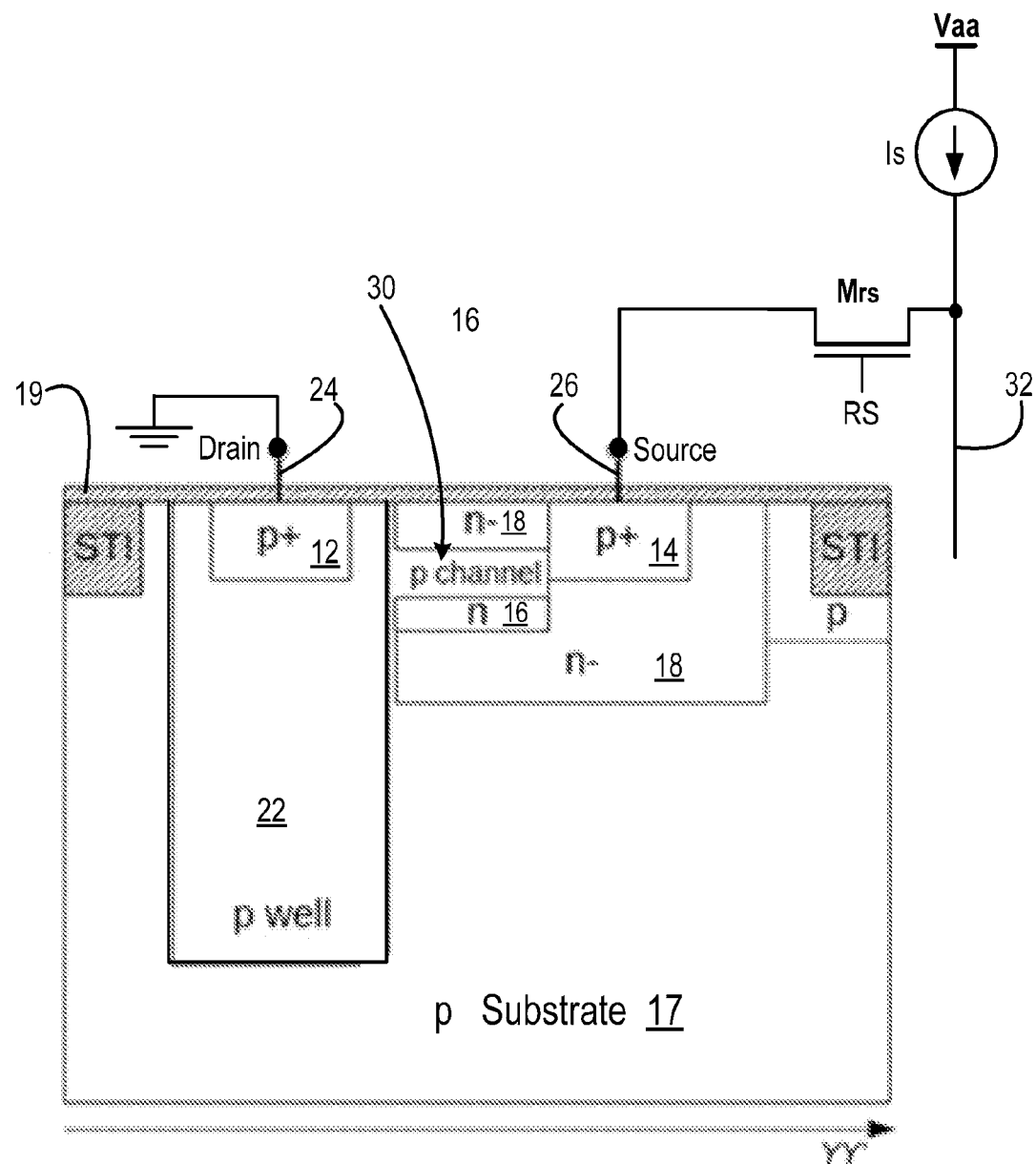
FIGS. 2A and 2B schematically depict respective orthogonal cross-sectional views of an illustrative pixel according to an alternative embodiment of a pixel according to some embodiments of the present disclosure.
Figure 2B:
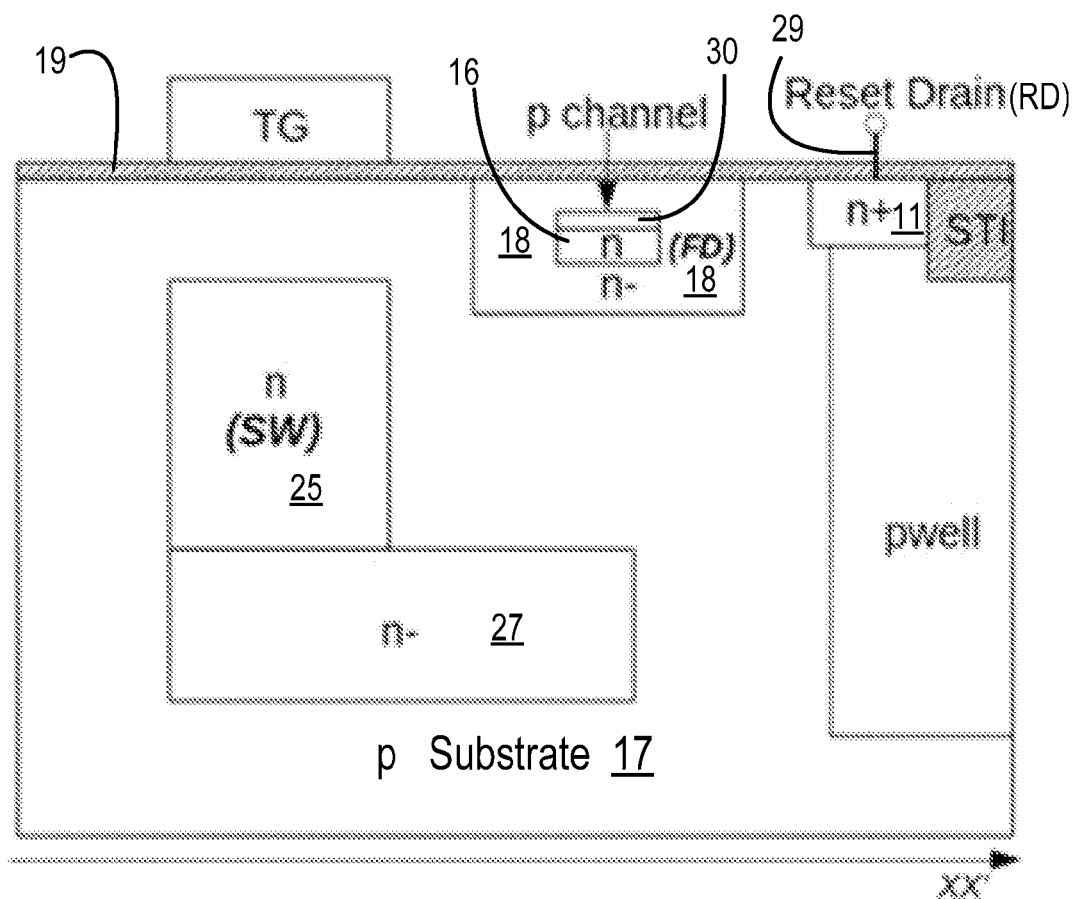

Compared to a MOSFET source follower with Si—SiO$_2$ interface traps, a JFET source follower will have better noise performance, but because the p-channel has extremely high sensitivity to potential change, the surface interface traps might still cause unnecessary read-out noise. Accordingly, some embodiments may be implemented with a buried channel source follower to further improve the noise performance. For example, FIGS. 2A and 2B depict schematic orthogonal cross-sectional views of an illustrative embodiment similar to the illustrative embodiment of FIGS. 1A-1C, but with a buried p-type channel 30 formed and surrounded by the n-doping well 18. As can be seen, the FD n-type region 16 that acts as the FD charge storage region and the JFET gate is disposed below the channel 30.

As a non-limiting example simply to further illustrate aspects of some embodiments, a jot device with a pump-gate TG, a gate-less reset, and a JFET source follower, similar to the illustrative embodiment of FIG. 1A-1C, was simulated in Synopsys TCAD. In this example, the photodiode SW had a full well capacity of 350 e−, and the JFET was biased by a current source of 2 μA. Results of this illustrative simulation are further described with reference to FIGS. 3-8.

Figure 3:
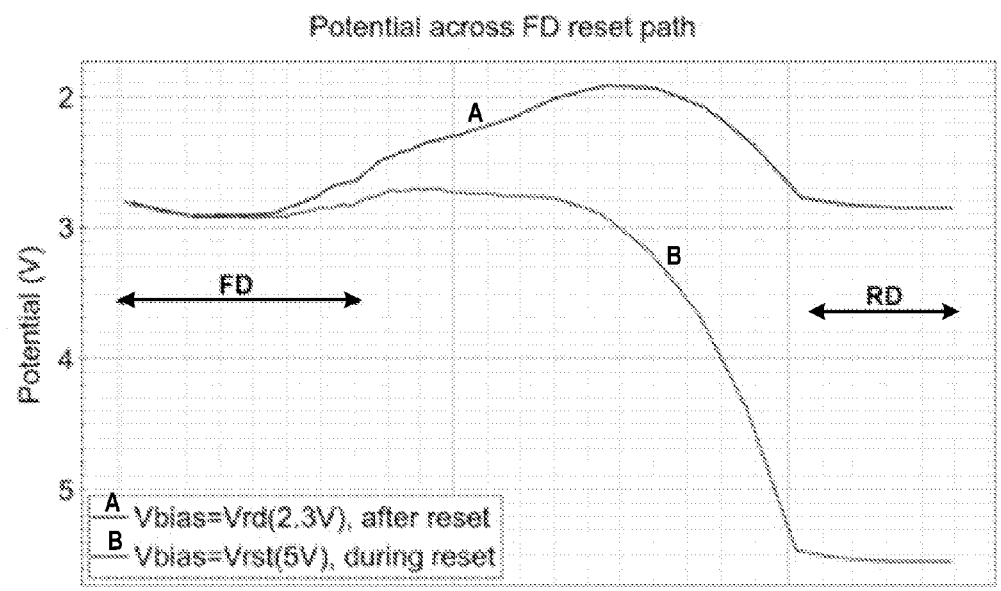
FIGS. 3-9 show results obtained by performing TCAD simulations of pixel structures according to some illustrative embodiments of the present disclosure.

In FIG. 3, the reset phase potential profile of the device is shown. In this example, the bias voltage of the reset drain changes between 5V to 2.3V. When the bias voltage is high, based on the fringing effect, the electrons in the FD will be transferred to the RD, and the potential of the FD would be increased to 2.8V. After reset, the bias voltage of the RD would be kept to 2.3V to maintain a potential barrier between the FD and RD and prevent charge leakage.

Figure 4:
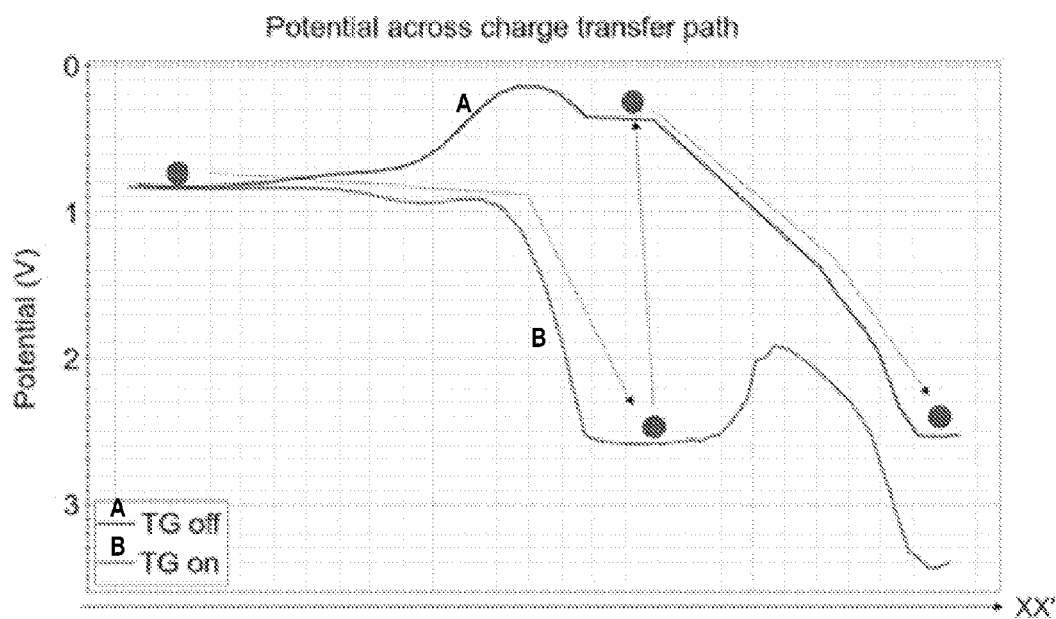

In FIG. 4, the charge transfer phase (SW to FD) potential profile is shown. In this example, during the charge transfer, the TG is biased by 2.5V, and as described in further detail in U.S. Provisional Application No. 61/973,825, there will be a monotonic potential increase from SW to p-type well region PW, and the charge will be transferred to the PW region temporarily. When the bias voltage of TG returns low, −0.5V, and the potential of PW becomes lower than the potential of the virtual barrier (VB) region, the electrons will flow over the virtual potential barrier and to the FD, and the double step charge transfer will be completed.

The transferred electrons accumulate in the FD, and they will modulate the gate potential of the JFET source follower. The TCAD simulations also demonstrated the potential profile of the JFET source follower, showing that the potential of the FD changes after the charge transfer, which changes the depletion region width in the p-channel.

Figure 5:
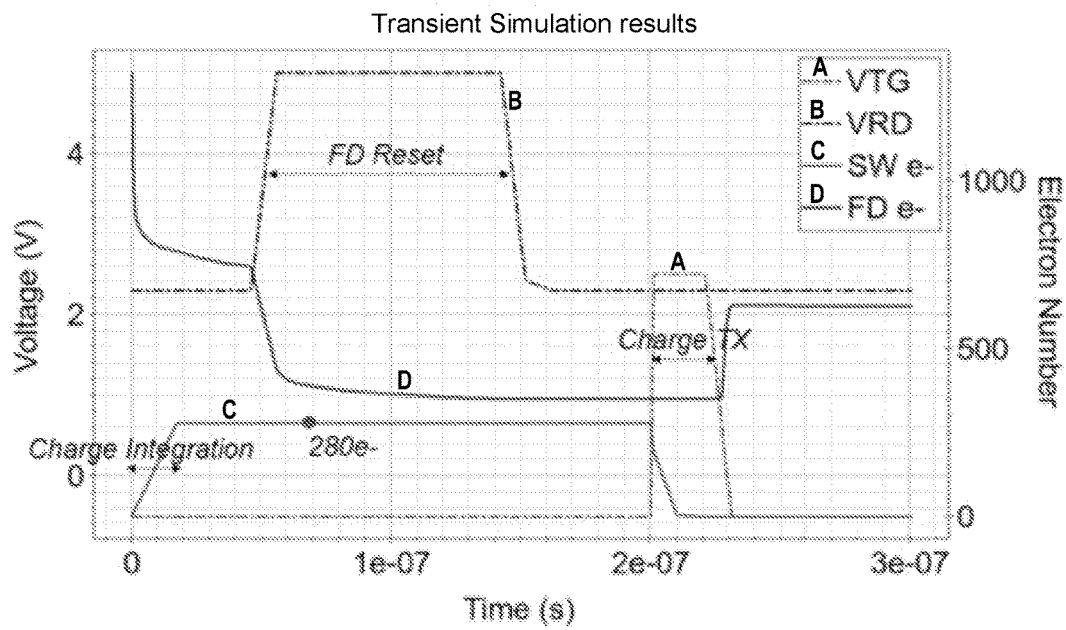
Figure 6:
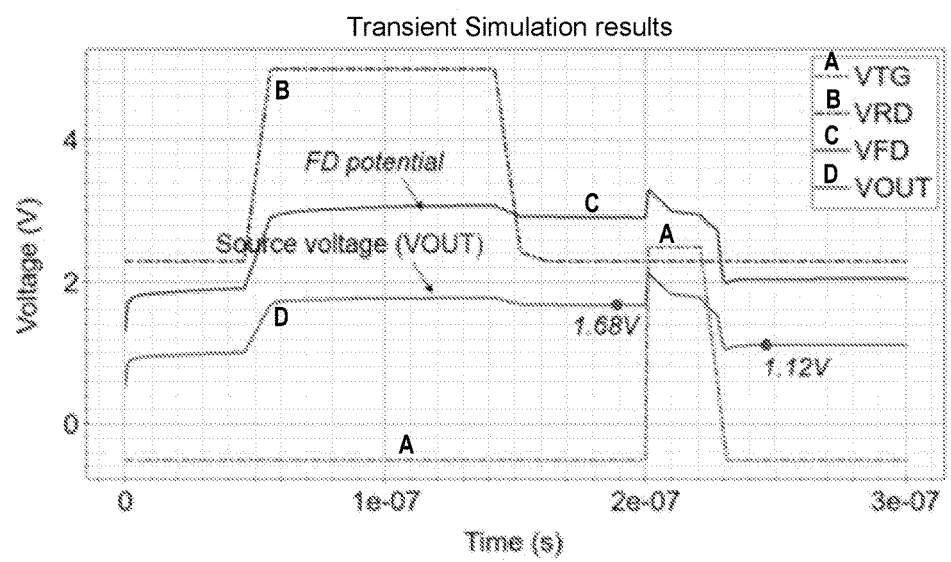

In the transient simulation results, which are depicted in FIG. 5, it can be observed that, during charge integration, 280 electrons are accumulated in SW. After charge transfer, SW is fully depleted, and 280 electrons are transferred to FD. In FIG. 6, it can be observed that after charge transfer, the change of the FD potential is 850 mV, which leads to an output voltage change of 560 mV. The gain of the source follower is 0.65, and the charge-to-voltage conversion gain is 2 mV/e−.

Figure 7:
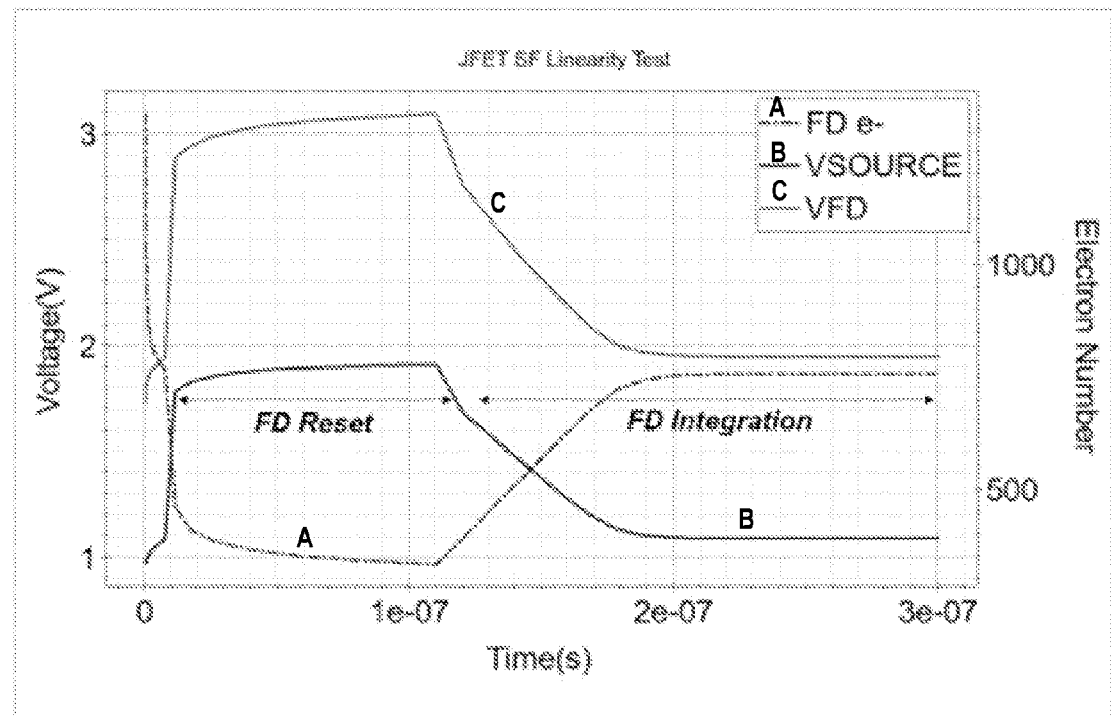

The linearity of the JFET source follower was also tested. As depicted in FIG. 7, the electron number in the FD reaches 335 e− after reset, and it saturates at 760 e−. The FD and the output of the source follower have a linear response proportional to the accumulated electrons when the number of the electrons is below approximately 688 e−.

Figure 8:
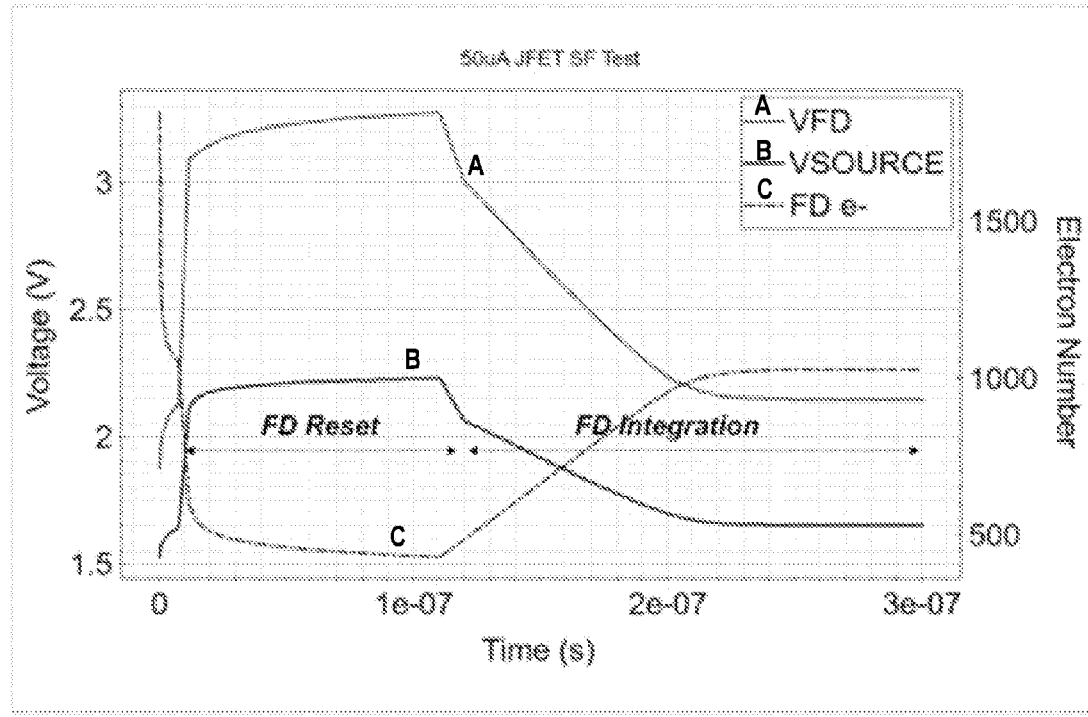

In the simulation example, a 2 μA column bias current was used, and in this design, the bias current can be modified from 100 nA to 5 μA. It is possible to further increase the bias current by changing the dose of the FD and the p-channel. The current-drive ability of the JFET SF is determined by the resistivity of the channel, and the current magnitude should be suitable to keep the source voltage lower than the potential of the FD to avoid gate-to-source leakage current. Another variation of the JFET SF which provides a current-drive ability of 50 μA is demonstrated in the simulation, as depicted in FIG. 8.

Figure 9A:
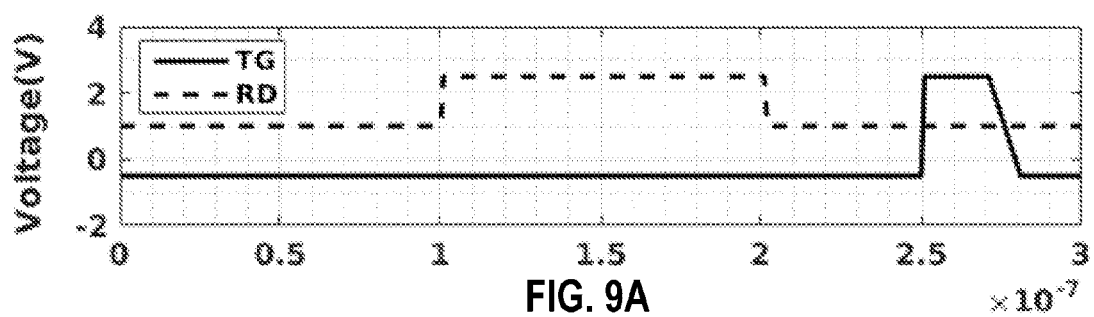
Figure 9B:
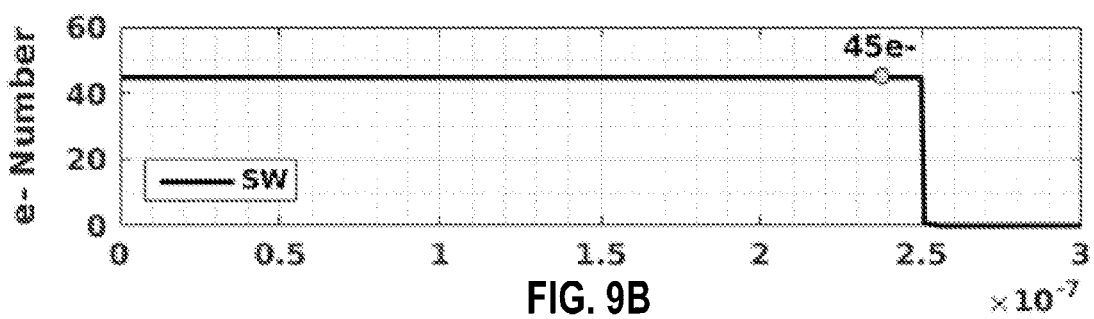
Figure 9C:
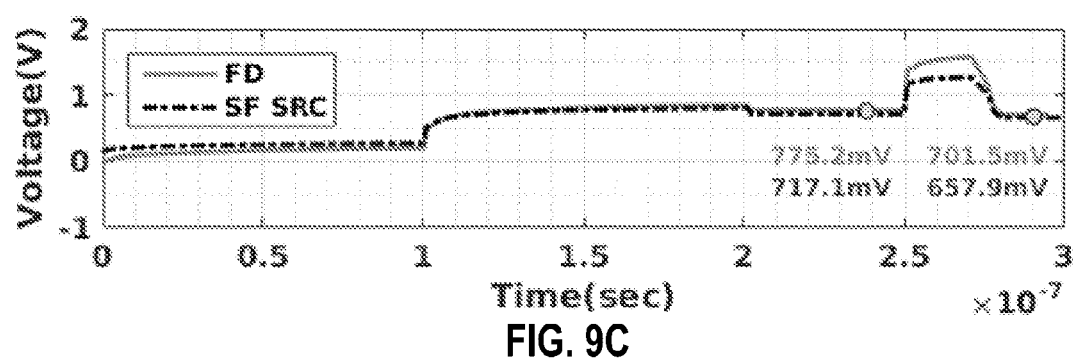

The results of yet a further TCAD simulation that was conducted for a pixel in accordance with the illustrative embodiments of the present disclosure are illustrated in FIGS. 9A, 9B, and 9C. Particularly, FIG. 9A shows the applied TG and RD signals, FIG. 9B shows the corresponding charge stored in the SW (which is transferred to the FD), and FIG. 9C shows the corresponding FD voltage and source-follower source voltage (SF SRC) along with measured FD and SF SRC voltage values before and after charge transfer.

In accordance with some embodiments, the JFET can also be read out using current modulation instead of voltage modulation mode. In this case, the change in FD (JFET gate) potential causes a change in output current that is detected by readout circuits well understood by those skilled in the art. See, e.g., *IEEE Transactions On Electron Devices*, vol. 44, No. 10, October 1997, pp. 1747-1758, "On-Focal-Plane Signal Processing for Current-Mode Active Pixel Sensors," which is hereby incorporated herein by reference in its entirety.

Figure 10:
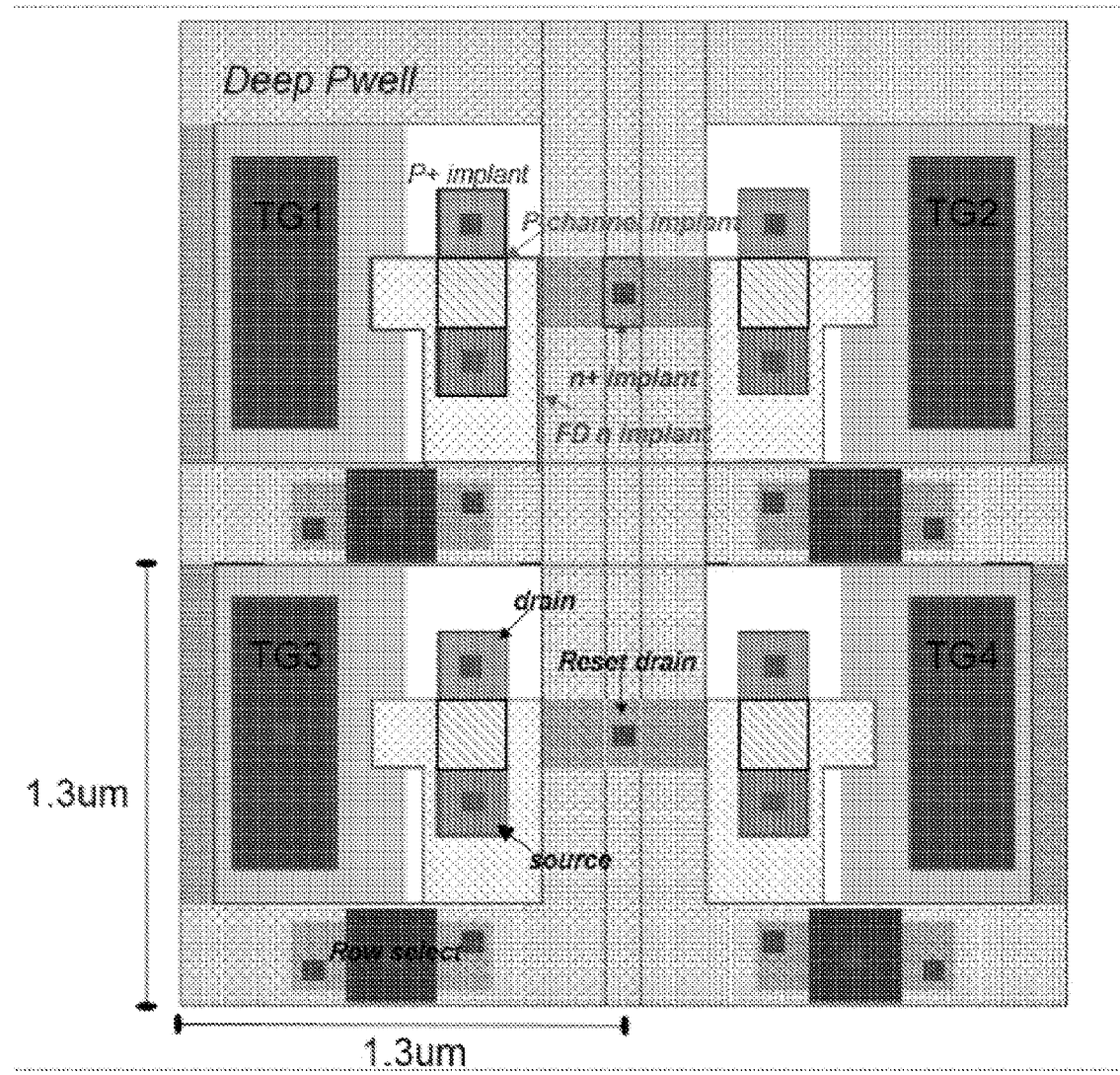
FIGS. 10 and 11 show respective illustrative layout designs according to some embodiments of the present disclosure using on a commercial 65 nm CMOS CIS process.
Figure 11:
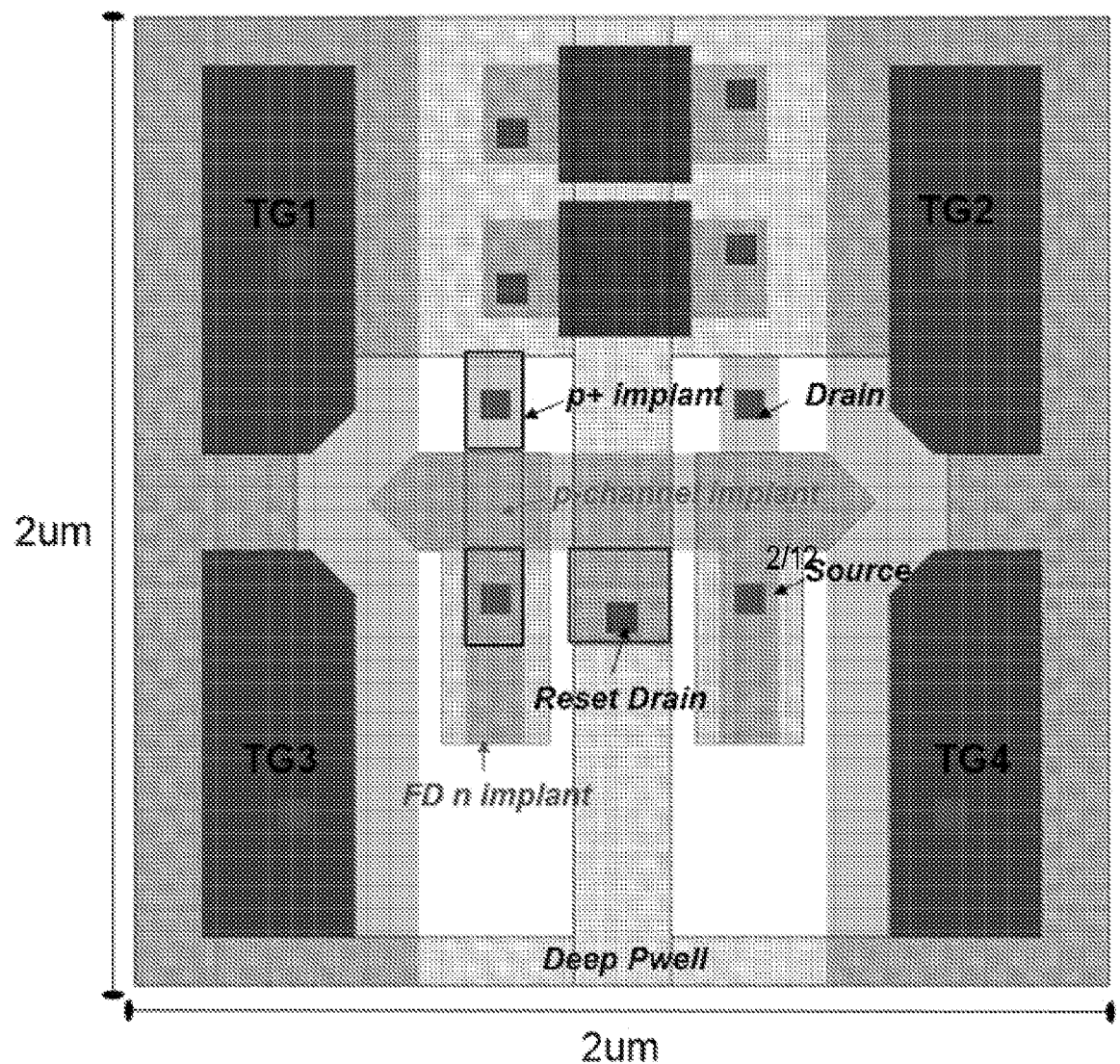

Two illustrative possible layout designs according to some embodiments based on a commercial 65 nm CMOS CIS process are illustrated in FIGS. 10 and 11. The fabrication of this device will not increase the mask count of the baseline process. The first layout has a pitch of 1.3 µm, as shown in FIG. 10. In this layout, two neighboring jots in one row share one reset drain, which helps to shrink the size. The second layout design has a pitch of 1 µm, as depicted in FIG. 11. This layout is configured as a 2-way shared readout, and in this case, four jots in one row share one reset drain. It will be understood, however, that myriad layout variations are possible for any given technology node and process.

Figure 12:
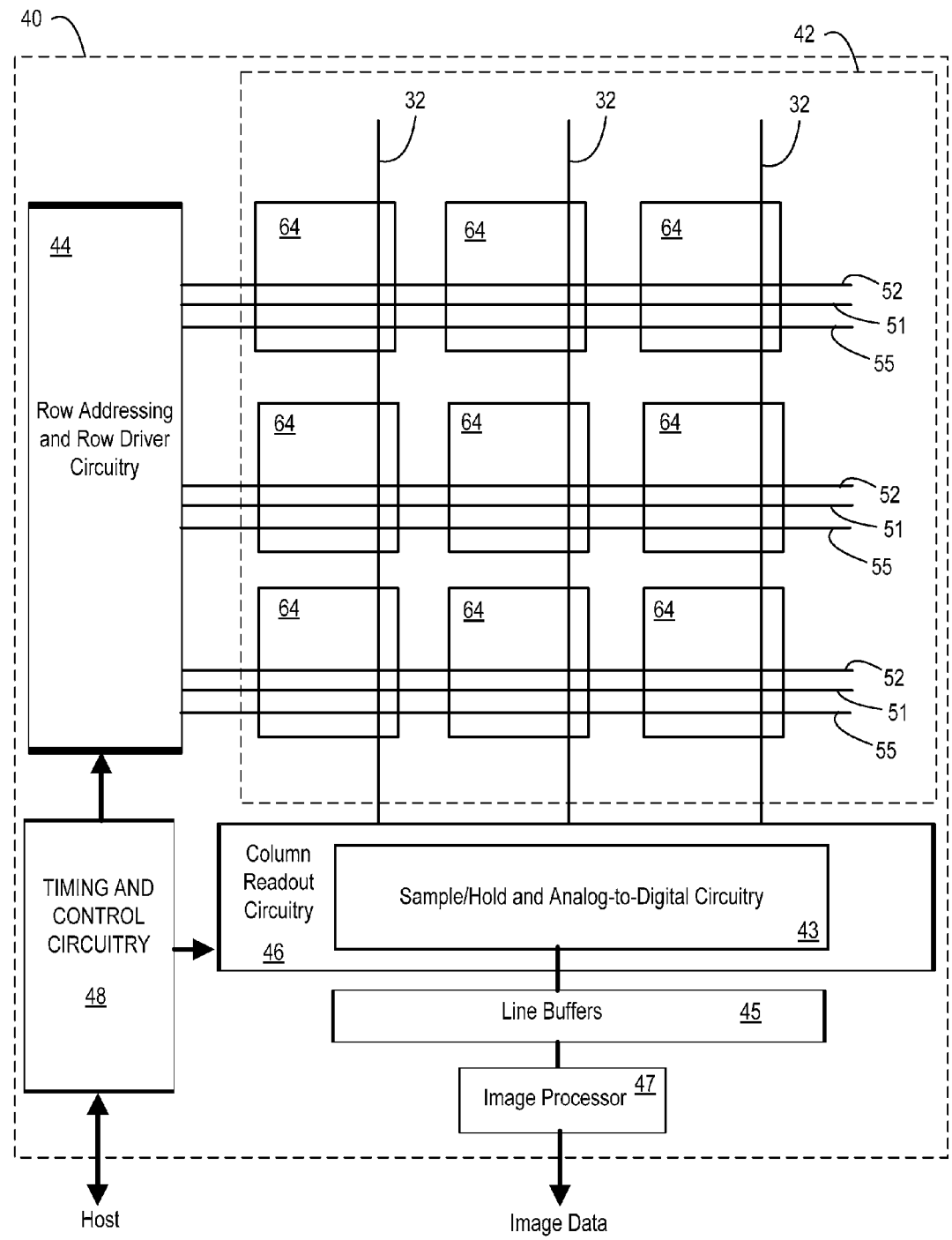
FIG. 12 depicts a block diagram of an illustrative image sensor architecture that may be used to implement some embodiments in accordance with the present disclosure.

FIG. 12 depicts a block diagram of an illustrative CMOS image sensor 40 architecture that may be used to implement embodiments in accordance with the present disclosure, such as embodiments comprising pixels that employ an FD that acts as the gate of a JFET SF, in accordance with those described hereinabove in connection with FIGS. 1A-1C, and 2A-2B. As well known, pixel array 42 typically includes a large number of pixels arranged in an MxN array; however, CMOS image sensor 40 is shown as including a simplified pixel array 42 comprising a three by three array of pixels 64, which, for ease of discussion, is a pixel circuit in accordance with any of the foregoing embodiments, but may be any of a variety of pixel circuit types that are configured to implement a JFET SF with the FD acting as the gate of the JFET in accordance with the present disclosure. And, for example, in some embodiments, the pixels may be shared pixels (e.g., sharing a FD and RD and possibly additional readout circuitry) and may further be configured for in-pixel binning.

Row Addressing and Row Driver Circuitry 44 generates transfer gate (TG) control signals on lines 51, row select (RS) signals on lines 55, and reset drain (RD) control signals on lines 52. Column Readout Circuitry 46 includes analog-to-digital circuitry 43 for sampling and digitizing output values readout from the pixel array 42. Particularly, circuitry 43 may be implemented to comprise a plurality of A/D converters configured to implement column-parallel readout. In some embodiments, the circuitry 43 may be configured such that the readout circuitry associated with each column bus 32 may have a respective analog-to-digital converter (ADC), though in some embodiments pairs of columns may share an ADC.

Timing and control circuitry 48 controls both the row addressing and row driver circuitry 44 and the column readout circuitry 43. For instance, timing and control circuitry controls the row addressing and row driver circuitry 44 for selecting the appropriate row for readout, and may, for example, provide timing control signals in accordance with rolling shutter readout or global shutter readout. As indicated in FIG. 12, timing and control circuitry 48 may also communicably interface with a host (e.g., a processor associated with a system comprising the image sensor), which may, for example, in some implementations, specify various control information.

As schematically depicted, signals on column buses 32 are sampled and digitized by circuitry 43, and the digitized pixel values provided by the ADCs may be provided to line buffers 45, which may be used to temporarily store digital signals from circuitry 43 for use by image processor 47. In general, any number of line buffers 45 may be included and, for example, each line buffer may be capable of storing digital signals representative of the charge signals that may be read from each pixel in a given row of pixels in the pixel array 42. Image processor 47 may be used to process the digital signals held in line buffers 36 to produce output image data that may be provided to a device external to the image sensor 40.

As may be appreciated, there are many possible alternative implementations of an image sensor architecture that may embody pixels having a FD and JFET SF with the FD acting as the JFET gate in accordance with some embodiments of the present disclosure. By way of example, it will be understood that circuitry 46 may be divided into two portions provided at the top and bottom of the pixels array.

It will also be understood in view of the foregoing that some embodiments of the disclosed pixel are well-suited for shared pixels, namely, in shared pixel architectures that share at least the floating diffusion and the reset drain/diffusion (e.g., and which, for example, may also share the source-follower, etc.). (As known to those skilled in the art, such shared architectures may be used for in-pixel charge-domain binning.) By way of example, in some embodiments a four-way shared pixel structure/unit can be used (e.g., possibly comprising 7 transistors per shared pixel unit), which will further shrink the size of each pixel (e.g., each jot of a QIS). And in some such shared-pixel embodiments, the four jots sharing a common FD can be covered by a single color filter and micro lens, which will mitigate the effects of cross-talk between jots. Further, in some such embodiments, each shared-pixel unit comprising four jots (e.g., and having a single color filter and microlens) can be isolated by a single Deep Trench Isolation (DTI) around the set of four jots. That is, four jots sharing a FD are not isolated from each other by DTI, but rather are collectively isolated by DTI from other shared pixel units (i.e., other units of four jots sharing an FD). Such DTI will further reduce cross talk between shared pixel units associated with respective color filters. It will be understood that other configurations of shared pixel units (e.g., different numbers of jots sharing a common FD) may be implemented accordingly.

In addition, it will be understood that a FD acting as the gate of a JFET SF in an image sensor pixel in accordance with various embodiments of the present invention may be implemented in backside illuminated (BSI) or frontside illuminated image sensors. In other words, embodiments of the present disclosure are not limited exclusively to only one of backside and frontside illuminated image sensors.

Further, for example, while pixels according to some embodiments of the present invention are well-suited for use in image sensors demanding very high conversion gain (e.g., QIS, qDIS, or other single-bit or multi-bit photoelectron counting sensors), it will be understood in view of the ensuing disclosure that one or more features and/or embodiments of the present invention are also applicable to conventional CMOS image sensors (e.g., present-day, commercially available CMOS image sensors for consumer, manufacturing, and/or scientific applications). Similarly, it will be understood, for example, that a FD configured as a JFET gate in accordance with the present disclosure is not limited to being used together with a pump-gate and distal FD, nor necessarily with a gateless reset, regardless of whether the pixel is a QIS-type pixel.

Various embodiments of the present invention may be used in configurations that include color filter arrays and microlenses, and where individual photoelements may be isolated using shallow or deep trench techniques that are common in state of the art image sensors. Furthermore, additional signal processing associated with quanta image sensors may be incorporated on the same chip as the photodetector array. The image signal processing may be incorporated in a stacked layer in manner similar to state of the art stacked CMOS image sensor arrays, where one chip in the stack is optimized for photodetector element devices, and the another chip for mixed signal circuits, with interconnects between the stacked layers.

The present invention has been illustrated and described with respect to some specific illustrative embodiments thereof, which embodiments are merely illustrative of some of the principles of some embodiments of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. An image sensor comprising a plurality of pixels, at least one pixel comprising:
   a floating diffusion region formed in a semiconductor substrate;
   a transfer gate configured to selectively cause transfer of photocharge stored in the pixel to the floating diffusion;
   a JFET having (i) a source and a drain coupled by a channel region, and (ii) a gate comprising the floating diffusion region; and
   wherein the channel region comprises a first doped region of a first conductivity type configured to conduct current between the source and drain along a lateral direction substantially parallel to a surface of the substrate, the floating diffusion region comprises a second doped region of a second conductivity type opposite to the first conductivity type, and wherein the second doped region of the floating diffusion is disposed adjacent to and beneath the first doped region along the lateral direction between the source and drain.

2. The image sensor according to claim 1, wherein the floating diffusion and the channel region are configured such that charge selectively transferred to the floating diffusion by operation of the transfer gate modulates current flow between the source and drain via the channel region.

3. The image sensor according to claim 1, wherein the floating diffusion and the channel region are configured such that charge selectively transferred to the floating diffusion by operation of the transfer gate causes a change in the gate potential that is followed by the potential of the source.

4. The image sensor according to claim 1, wherein the capacitance of floating diffusion is small enough to provide a conversion gain of at least 500 µV/e− and the image sensor is configured as a QIS.

5. The image sensor according to claim 1, wherein the channel is configured as a buried channel.

6. The image sensor according to claim 1, wherein the image sensor is configured as a backside-illuminated device.

7. The image sensor according to claim 1, wherein the transfer gate is spaced away from and does not overlap the floating diffusion.

8. The image sensor according to claim 1, wherein the floating diffusion is configured to be reset using a reset drain without a reset gate.

9. The image sensor according to claim 8, wherein the transfer gate is spaced away from and does not overlap the floating diffusion.

10. The image sensor according to claim 1, wherein the pixel comprises a photodiode disposed substantially beneath the transfer gate and having a charge storage/accumulation region that is configured to store the photocharge that is selectively transferred to the floating diffusion using the transfer gate.

11. The image sensor according to claim 1, wherein the pixels are configured as shared pixels.

12. The image sensor according to claim 1, wherein the channel is a p-type channel.

13. A method for providing an image sensor comprising a plurality of pixels, the method comprising:
   forming a floating diffusion in a semiconductor substrate;
   forming a transfer gate configured to selectively cause transfer of photocharge stored in the pixel to the floating diffusion; and
   forming a JFET in the semiconductor substrate, the JFET having (i) a source and a drain coupled by a channel region, and (ii) a gate comprising the floating diffusion region, wherein the channel region comprises a first doped region of a first conductivity type configured to conduct current between the source and drain along a lateral direction substantially parallel to a surface of the substrate, the floating diffusion region comprises a second doped region of a second conductivity type opposite to the first conductivity type, and wherein the second doped region of the floating diffusion is disposed adjacent to and beneath the first doped region along the lateral direction between the source and drain.

14. The method according to claim 13, wherein the floating diffusion and the channel region are configured such that charge selectively transferred to the floating diffusion by operation of the transfer gate modulates current flow between the source and drain via the channel region.

15. The method according to claim 13, wherein the floating diffusion and the channel region are configured such that charge selectively transferred to the floating diffusion by operation of the transfer gate causes a change in the gate potential that is followed by the potential of the source.

16. The method according to claim 13, wherein the capacitance of floating diffusion is small enough to provide a conversion gain of at least 500 μV/e– and the image sensor is configured as a QIS.

17. The method according to claim 13, wherein the channel is configured as a buried channel.

18. The method according to claim 13, wherein the transfer gate is spaced away from and does not overlap the floating diffusion.

19. The method according to claim 13, wherein the floating diffusion is configured to be reset using a reset drain without a reset gate.

20. An image sensor comprising a plurality of pixels, at least one pixel comprising:
a floating diffusion region formed in a semiconductor substrate;
a transfer gate configured to selectively cause transfer of photocharge stored in the pixel to the floating diffusion;
a JFET having (i) a source and a drain coupled by a channel region, and (ii) a gate comprising the floating diffusion region, wherein the channel region comprises a first doped region of a first conductivity type configured to conduct current between the source and drain along a lateral direction substantially parallel to a surface of the substrate; and
wherein the floating diffusion and the channel region are configured such that charge selectively transferred to the floating diffusion by operation of the transfer gate causes a change in the gate potential that is followed by the potential of the source.

21. The image sensor according to claim 20, wherein the transfer gate is spaced away from and does not overlap the floating diffusion.

22. The image sensor according to claim 20, wherein the floating diffusion is configured to be reset using a reset drain without a reset gate.

23. The image sensor according to claim 20, wherein the pixel comprises a photodiode disposed substantially beneath the transfer gate and having a charge storage/accumulation region that is configured to store the photocharge that is selectively transferred to the floating diffusion using the transfer gate.

* * * * *